United States Patent
Ikeda

(10) Patent No.: US 7,509,607 B2
(45) Date of Patent: Mar. 24, 2009

(54) MEMORY CIRCUIT HAVING A CROSSTALK-GLITCH SUPPRESSOR CIRCUIT AND A CONTROL DEVICE FOR CONTROLLING AN AMOUNT OF SUPPRESSION PERFORMED BY THE CROSSTALK-GLITCH SUPPRESSOR CIRCUIT

(75) Inventor: Yuuichirou Ikeda, Kobe (JP)

(73) Assignee: Panasonic Corporation, Osaka (JP)

( * ) Notice: Subject to any disclaimer, the term of this patent is extended or adjusted under 35 U.S.C. 154(b) by 327 days.

(21) Appl. No.: 11/304,775

(22) Filed: Dec. 16, 2005

(65) Prior Publication Data

US 2006/0133170 A1    Jun. 22, 2006

(30) Foreign Application Priority Data

Dec. 22, 2004    (JP)    ............... 2004-370948

(51) Int. Cl.
  G06F 9/45    (2006.01)
  G11C 7/02    (2006.01)
  G11C 8/00    (2006.01)

(52) U.S. Cl. ............... 716/6; 716/1; 716/4; 716/5; 716/16; 365/206; 365/230.05

(58) Field of Classification Search ............... 716/1, 716/4–6, 16; 365/52, 163, 171, 206, 207, 365/222, 230.6, 233.5, 552; 327/552; 257/213
See application file for complete search history.

(56) References Cited

U.S. PATENT DOCUMENTS

| | | | | |
|---|---|---|---|---|
| 4,044,342 A | * | 8/1977 | Suzuki et al. ............... | 365/222 |
| 5,764,591 A | * | 6/1998 | Matsui et al. ............... | 365/233.5 |
| 5,798,961 A | * | 8/1998 | Heyden et al. ............... | 365/52 |
| 5,956,288 A | * | 9/1999 | Bermingham et al. .. | 365/230.06 |
| 6,058,451 A | * | 5/2000 | Bermingham et al. ....... | 711/106 |
| 6,121,646 A | * | 9/2000 | Higuchi et al. ............... | 257/213 |
| 6,128,238 A | * | 10/2000 | Nagai et al. ............... | 365/207 |
| 6,307,793 B1 | | 10/2001 | Murakami | |
| 6,549,445 B2 | * | 4/2003 | Ooishi et al. ............... | 365/63 |
| 6,563,737 B2 | * | 5/2003 | Khouri et al. ............... | 365/185.21 |
| 6,578,185 B1 | * | 6/2003 | Kelly ............... | 716/16 |
| 6,778,427 B2 | * | 8/2004 | Odagawa et al. ............... | 365/158 |
| 6,791,876 B2 | * | 9/2004 | Tanizaki et al. ............... | 365/171 |
| 7,239,572 B2 | * | 7/2007 | Ikeda ............... | 365/230.05 |
| 7,409,659 B2 | * | 8/2008 | Chakraborty et al. ......... | 716/10 |
| 2002/0163380 A1 | * | 11/2002 | Hughes ............... | 327/552 |
| 2003/0145296 A1 | * | 7/2003 | Chandra et al. ............... | 716/6 |
| 2006/0039227 A1 | * | 2/2006 | Lai et al. ............... | 365/230.03 |

FOREIGN PATENT DOCUMENTS

JP    07-161187 A    6/1995

* cited by examiner

*Primary Examiner*—Helen Rossoshek
(74) *Attorney, Agent, or Firm*—McDermott Will & Emery LLP

(57) ABSTRACT

The memory circuit comprises: a single or a plurality of reading-out port(s); a single or a plurality of writing port(s); a crosstalk-glitch suppressor circuit for suppressing crosstalk glitch between internal signal lines of each of the ports; and a control device for controlling capacity of the crosstalk-glitch suppressor circuit.

19 Claims, 7 Drawing Sheets

MEMORY CIRCUIT HAVING A CROSSTALK-GLITCH SUPPRESSOR CIRCUIT AND A CONTROL DEVICE FOR CONTROLLING AN AMOUNT OF SUPPRESSION PERFORMED BY THE CROSSTALK-GLITCH SUPPRESSOR CIRCUIT

BACKGROUND OF THE INVENTION

1. Field of the Invention

The present invention relates to a memory circuit that is constituted of a memory holding circuit including a memory holding part formed on a semiconductor substrate. More particularly, it is effectively used as a memory circuit with a memory holding circuit such as a register file, SRAM (static random access memory), etc.

2. Description of the Related Art

Conventionally, a memory circuit with a large number of ports requires a large number of internal signal lines such as word lines, bit lines, etc., which are disposed adjacent to each other for saving the area. Therefore, in accordance with micronization of the process, crosstalk glitches between each of the signals have become conspicuous. As a measure for this, there has been proposed a crosstalk-glitch suppressor circuit (referred to as a suppressor circuit hereinafter) (see Japanese Patent Unexamined Publication 2001-14858, Japanese Granted Patent Publication No. 3057990, for example).

Although providing an effect, the suppressor circuit is also a load to the internal signal lines, which causes an increase in the power consumption and deterioration in the operation speed. For example, referring to the case of the suppressor circuit disclosed in Japanese Patent Unexamined Publication 2001-14858, as shown in FIG. 4, writing word line WWL1-1 is fixed to non-selected potential for suppressing crosstalk glitches when a reading-out word line RWL1-2 is a selected potential. On the other hand, drain capacitance is additionally applied to the writing word line and gate capacitance is additionally applied to the reading-out word line as well, thereby causing an increase in the power and deterioration in the operation speed for the amounts of those capacitances.

There are cases without having a problem of crosstalk glitches depending on conditions of power supply voltage, process state, operation frequency, etc. Under such conditions, there is no suppressor circuit required and, inversely, a bad influence may be exerted on the power due to a heavy load to the wirings and on the operation speed especially when the operating power supply voltage is low.

SUMMARY OF THEE INVENTION

The main object of the present invention therefore is to provide a memory circuit with a large number of ports, which comprises a suppressor circuit for suppressing crosstalk glitches between internal signal lines of each port and a control device for controlling capacity of the suppressor circuit. Thereby, it becomes possible to adjust the capacity of the suppressor circuit in accordance with the power supply voltage for operating the memory circuit, the frequency, etc, and to decrease a bad influence exerted on the power and operation speed by the suppressor circuit.

Another object of the present invention is to achieve reduction in the area and the number of designing steps by devising a method for mounting a circuit that controls the capacity of the suppressor circuit.

A memory circuit according to a first aspect of the present invention comprises: a single or a plurality of reading-out port(s); a single or a plurality of writing port(s); a crosstalk-glitch suppressor circuit for suppressing crosstalk glitch between internal signal lines of each of the ports; and a control device for controlling capacity of the crosstalk-glitch suppressor circuit.

With the memory circuit according to the first aspect of the present invention, the capacity of the suppressor circuit is adjusted for reducing the capacity of the suppressor circuit when the capacity is not necessary. This allows suppression of a bad influence upon the original operation of the circuit, i.e. an increase in the power and deterioration in the operation speed.

In the memory circuit according to a second aspect of the present invention, the crosstalk-glitch suppressor circuit is disposed at a plurality of positions on the signal line.

With the memory circuit according to the second aspect of the present invention, it is possible to provide the necessary suppression capacity separately to each position when the values of the crosstalk glitches generated in a plurality of positions on the signal line are different. Therefore, bad influences on the original operation of the circuit can be suppressed to minimum.

In the memory circuit according to a third aspect of the present invention, the crosstalk-glitch suppressor circuit is provided to each of the ports.

With the memory circuit according to the third aspect of the present invention, it is possible to provide the necessary suppression capacity separately for each position when the values of the crosstalk glitches are different between each of the reading-out ports or writing ports, or when the operation speeds are different. Therefore, bad influences on the original operation of the circuit can be suppressed to minimum.

In the memory circuit according to a fourth aspect of the present invention, the control device controls the capacity of the crosstalk-glitch suppressor circuit by each suppressor circuit.

With the memory circuit according to the fourth aspect of the present invention, it is possible to provide the necessary suppression capacity separately for each position and port when the values of the crosstalk glitches are different between a plurality of positions on the signal line or between each of the ports. Therefore, bad influences on the original operation of the circuit can be suppressed to minimum.

In the memory circuit according to a fifth aspect of the present invention, the control device controls the capacity of the suppressor circuit by controlling substrate potential of the crosstalk-glitch suppressor circuit.

With the memory circuit according to the fifth aspect of the present invention, the capacity of the suppressor circuit can be adjusted without changing the structure of the suppressor circuit. Thus, bad influences on the original operation of the circuit can be suppressed to minimum by a small number of designing steps.

In the memory circuit according to a sixth aspect of the present invention, the control device controls the capacity of the suppressor circuit by controlling the number of connections of the crosstalk-glitch suppressor circuit.

With the memory circuit according to the sixth aspect of the present invention, a plurality of the suppressor circuits with the same structure can be used. Thus, bad influences on the original operation of the circuit can be suppressed to minimum by a small number of designing steps.

In the memory circuit according to a seventh aspect of the present invention, the control device controls the capacity of the suppressor circuit by controlling the timing of generating the capacity of the crosstalk-glitch suppressor circuit.

With the memory circuit according to the seventh aspect of the present invention, it is possible to deal with the case that requires the capacity of the suppressor circuit for a long time by adjusting the generation timing of the capacity. Further, in the case where high-harmonic crosstalk glitch overlaps on the signal line as the suppression target, use of a plurality of suppressor circuits with different generation timing of suppression capacities allows reduction of the high-harmonic component.

In the memory circuit according to an eighth aspect of the present invention, the control device generates a control signal according to a value of crosstalk glitch generated in the memory circuit.

With the memory circuit according to the eighth aspect of the present invention, the capacity of the suppressor circuit can be controlled according to the value of the crosstalk glitch generated in the section as a target of the suppression. Thus, it is possible to control the capacity in accordance with the action of the actual circuit.

In the memory circuit according to a ninth aspect of the present invention, the control device generates a control signal according to a value of crosstalk glitch generated in a replica circuit that is provided in the memory circuit or outside the memory circuit.

With the memory circuit according to the ninth aspect of the present invention, it is possible to control the capacity of the suppressor circuit in accordance with the action of the actual circuit without adding an extra circuit to the main-body circuit.

In the memory circuit according to a tenth aspect of the present invention, the control device generates, according to a value of crosstalk glitch in one clock cycle, a control signal in a clock cycle that is the same as the one clock cycle.

With the memory circuit according to the tenth aspect of the present invention, the capacity of the suppressor circuit necessary for each clock cycle can be obtained, thereby providing effects readily responding to the actual operation of the circuit.

The memory circuit according to an eleventh aspect of the present invention, the control device generates, according to a value of crosstalk glitch in one clock cycle, a control signal in a clock cycle that is after the one clock cycle.

With the memory circuit according to the eleventh aspect of the present invention, when the circuit action between the clock cycles is stable, it is possible to obtain the capacity of the suppressor circuit required for each clock cycle and to have sufficient generation time. Thus, the effect can be achieved by a simple circuit.

In the memory circuit according to a twelfth aspect of the present invention, the control device fixes, according to a value of crosstalk glitch in one clock cycle, a control signal for the one clock cycle and after.

With the memory circuit according to the twelfth aspect of the present invention, by judging the value of the crosstalk glitch at the time of testing the circuit or the like and fixing the control signal based on that value, it is possible to set the necessary and minimum capacity of the suppressor circuit without mounting a complicated control circuit.

The memory circuit according to a thirteenth aspect of the present invention, the control device controls the capacity of the suppressor circuit by a control signal applied form outside the memory circuit.

With the memory circuit according to the thirteenth aspect of the present invention, it is possible to control the capacity of the suppressor circuit without mounting an extra control circuit inside the memory circuit. Thus, the area of the memory circuit and the number of designing steps can be reduced.

In the memory circuit according to a fourteenth aspect of the present invention, the control signal applied form outside is generated in a processor core.

With the memory circuit according to the fourteenth aspect of the present invention, the capacity of the suppressor circuit can be controlled by a control from the core side. Thus, the area of the memory circuit and the number of designing steps can be reduced.

In the memory circuit according to a fifteenth aspect of the present invention, the control signal applied form outside is generated in a BIST circuit.

With the memory circuit according to the fifteenth aspect of the present invention, the capacity of the suppressor circuit can be determined by judging the value of the crosstalk glitch at the time of testing the memory circuit. In addition, it does not require an extra control circuit inside the memory circuit so that the area and the number of designing steps can be reduced.

In the memory circuit according to a sixteenth aspect of the present invention, the control device controls the capacity of the suppressor circuit by a control signal generated inside the memory circuit.

In the memory circuit according to the sixteenth aspect of the present invention, the suppressor circuit is controlled inside the memory circuit in a closed state. Thus, the effect can be achieved without exerting influences on the designs of the processor core and the peripheral circuits.

In the memory circuit according to a seventeenth aspect of the present invention, the control device controls the capacity of the suppressor circuit by a control signal that is generated according to power supply voltage for operating the memory circuit.

With the memory circuit according to the seventeenth aspect of the present invention, when the power supply voltage is low to an extent where the capacity of the suppressor circuit is not required, the capacity of the suppressor circuit is decreased. Thereby, the influence that causes deterioration of the operation speed can be suppressed.

In the memory circuit according to an eighteenth aspect of the present invention, the control device controls the capacity of the suppressor circuit by a control signal that is generated according to frequency by which the memory circuit is operated.

With the memory circuit according to the eighteenth aspect of the present invention, when the operation frequency is low to an extent where the capacity of the suppressor circuit is not required, the capacity of the suppressor circuit is decreased. Thereby, the influence that causes deterioration of the operation speed can be suppressed.

In he memory circuit according to a nineteenth aspect of the present invention, the control device controls the capacity of the suppressor circuit by a control signal that is generated according to potential of an internal signal line as a target of crosstalk-glitch suppression.

With the memory circuit according to the nineteenth aspect of the present invention, when the potential of the internal signal line as the target of the crosstalk-glitch suppression is decreased by the resistance component of the internal power supply wiring, the capacity of the suppressor circuit is decreased. Thereby, the influence that causes deterioration of the operation speed can be suppressed.

BRIEF DESCRIPTION OF THE DRAWINGS

The present invention is illustrated be way of example and not limitation in the figures of accompanying drawings, in which like references indicate similar elements and in which.

DETAILED DESCRIPTION OF THE INVENTION

A preferred embodiment of the present invention will be described hereinafter by referring to the accompanying drawings.

Figure 1:
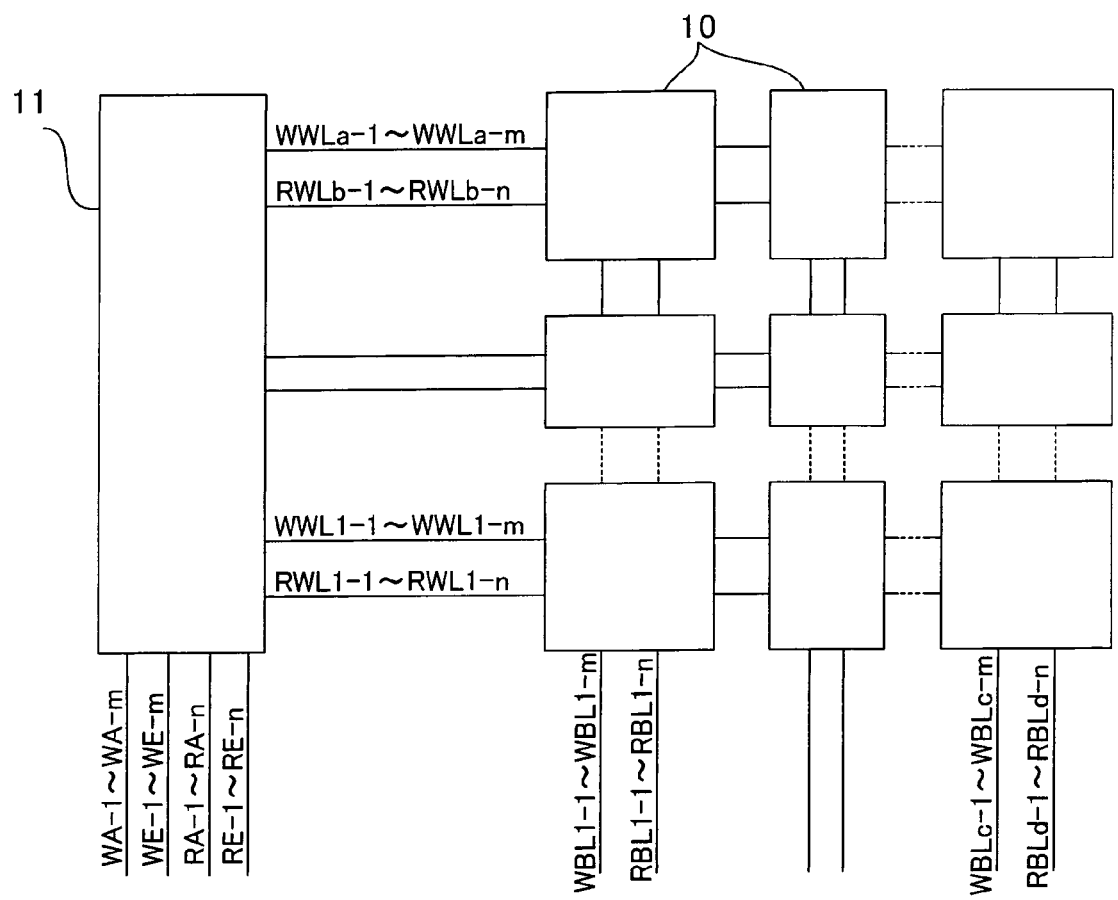
FIG. 1 is a circuit block diagram of a memory circuit for showing the structure of a memory cell as a memory holding circuit according to a preferred embodiment of the present invention and peripheral circuit thereof.
Figure 2:
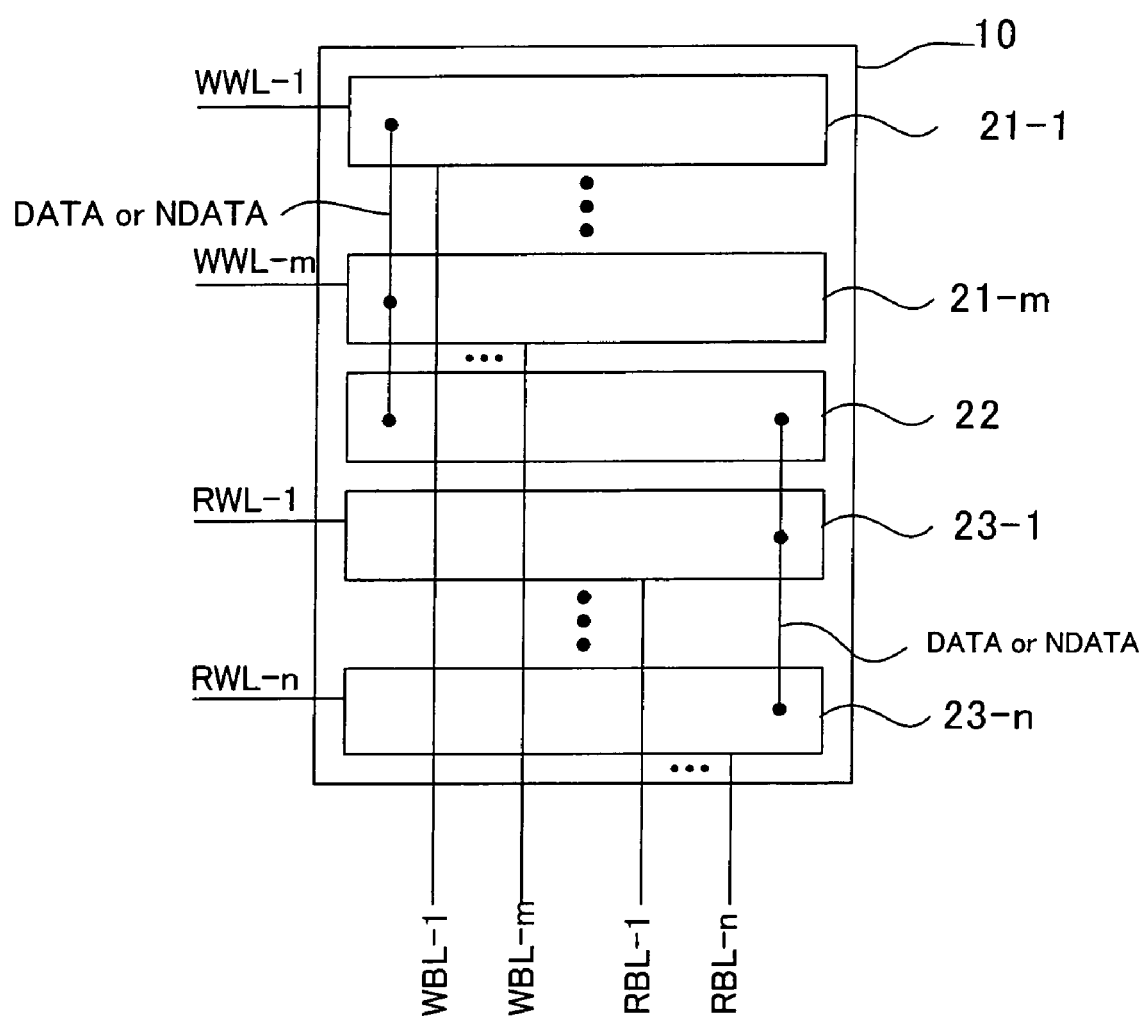
FIG. 2 is a circuit block diagram for showing the memory cell as the memory holding circuit according to the preferred embodiment of the present invention.
Figure 3:
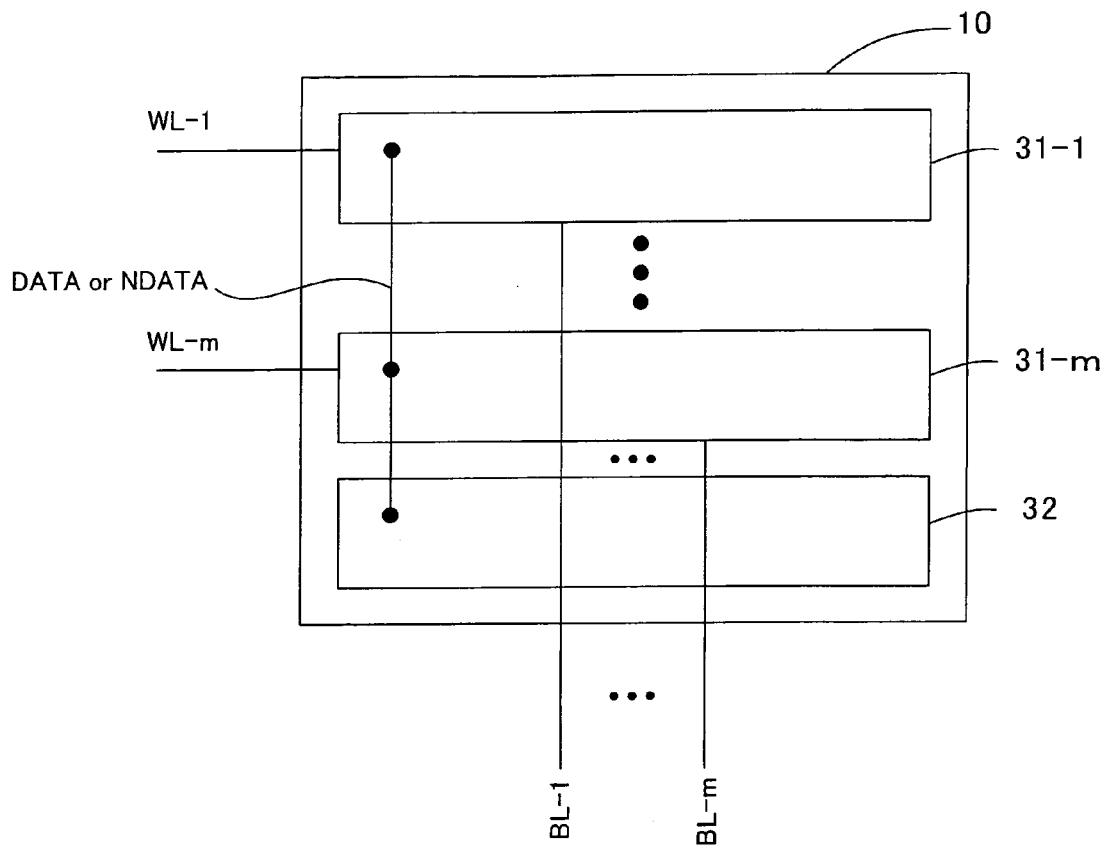
FIG. 3 is a circuit block diagram for showing the memory cell as the memory holding circuit according to the preferred embodiment of the present invention.

FIG. 1 is a block diagram of a memory circuit for showing a memory cell as a memory holding circuit according to a preferred embodiment of the present invention and peripheral circuit thereof. FIG. 2 and FIG. 3 are circuit block diagrams for showing the structure of the memory cell shown in FIG. 1.

In FIG. 1, reference numeral 10 is a single memory cell or array-type memory cell, and 11 is a row decoder. In FIG. 2, 21-1 to 21-m (m is an integer of 1 or larger) are m-numbers of writing sections, 22 is a memory holding section, 23-1 to 23-n (n is an integer of 1 or larger) are n-numbers of reading-out sections. FIG. 3 illustrates a memory cell 10 with common writing and reading-out section, in which 31-1 to 31-m (m is an integer of 1 or larger) are m-numbers of writing/reading-out sections, and 32 is a memory holding section. In FIG. 2 and FIG. 3, DATA is a data line, and NDATA is an inversion data line.

A plurality of memory cells 10 are arranged in line in directions of row and column, respectively. Writing word lines (enabling lines) WWL1-1 to WWLa-m (a is an integer of 1 or larger) and reading-out lines (enabling lines) RWL1-1 to RWLb-n (b is an integer of 1 or larger) are arranged along the respective row directions in the state to connect the memory cells 10 that are arranged in the row direction.

The writing word lines WWL1-1 to WWLa-m are selected by the row decoder 11 based on writing address signals WA-1 to WA-m inputted from outside. The reading-out lines RWL1-1 to RWLb-n are selected by the row decoder 11 based on reading-out address signals RA-1 to RA-n inputted from outside. Each of the signals WA-1 to WA-m and RA-1 to RA-n has a bit width of 1 bit or more. In FIG. 1, WE-1 to WE-m are writing enabling signals, and RE-1 to RE-n are reading-out enabling signals.

Depending on the structure of the memory cell, the inversion word lines may be provided in addition to the word lines. When the memory cell is in the structure shown in FIG. 3, the writing and reading-out word lines may become common as WL-1 to WL-m.

Further, writing word lines (enabling lines) WBL1-1 to WBLc-m (c is an integer of 1 or larger) and reading-out lines (enabling lines) RBL1-1 to RBLd-n (d is an integer of 1 or larger) are arranged along the respective column directions in the state to connect the memory cells 10 arranged in the column direction.

Depending on the structure of the memory cell, the inversion bit lines may be provided in addition to the bit lines. When the memory cell is in the structure shown in FIG. 3, the writing and reading-out bit lines may become common as BL-1 to BL-m.

Figure 5:
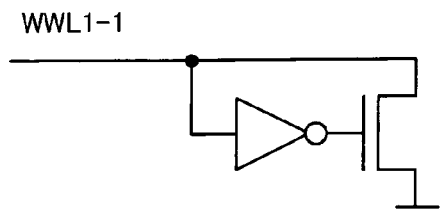
FIG. 5 is an illustration for showing a form of a crosstalk-glitch suppressor circuit according to the preferred embodiment of the present invention.
Figure 6:
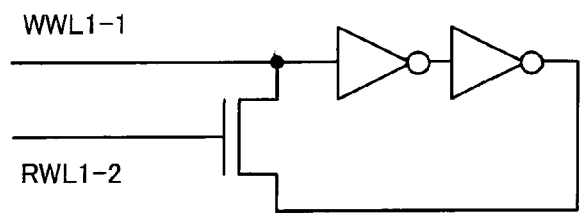
FIG. 6 is an illustration for showing a form of the crosstalk-glitch suppressor circuit according to the preferred embodiment of the present invention.
Figure 14:
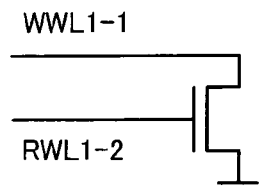
FIG. 14 is a block diagram of the crosstalk-glitch suppressor circuit.
Figure 15:
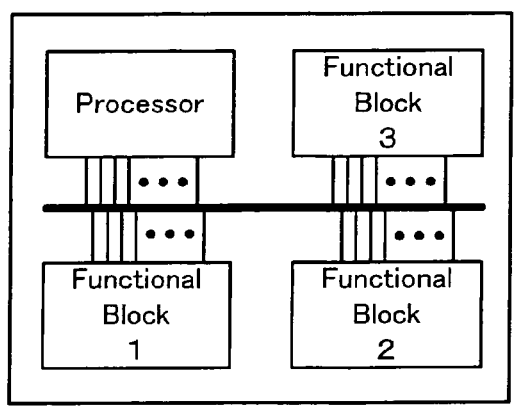
FIG. 15 is an illustration for showing the state of arranging the signal lines.

In FIG. 1, the suppressor circuit whose examples are shown in FIG. 14 and FIG. 5, FIG. 6 to be described later is disposed as necessary at a required section.

Figure 4:
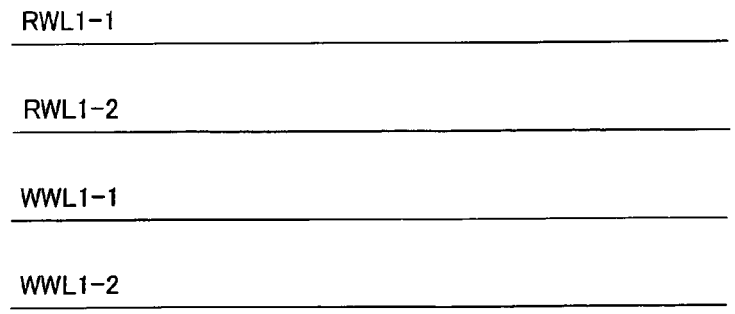
FIG. 4 is an illustration for showing an arrangement form of internal signal lines of the memory cell according to the preferred embodiment of the present invention.

In the memory circuit of FIG. 1 with a large number of ports, each of the word lines is arranged adjacent to each other as in FIG. 4 for saving the area. In the followings, description is provided by referring only to the case of the writing word lines, however, it is also the same for the reading-out word lines, bit lines, and other control lines. Further, the arrangement of the signal lines in FIG. 4 is merely an example and it is the same for the cases where the signal lines are arranged in different ways.

The adjacent arrangement of signal wirings as in FIG. 4 is also used for a processor within a System LSI circuit, wirings between functional blocks, and wirings within the processor and functional blocks. The suppressor circuit whose examples are shown in FIG. 14 and FIG. 5, FIG. 6 to be described later is disposed as necessary at a required section. The description of the writing word line is also applied to this case.

In the case of FIG. 4, there are crosstalk glitches generated in WWL1-1 from RWL1-2 and WWL1-2, which also occurs between other adjacent lines. For suppressing the crosstalk glitches, the suppressor circuits as shown in FIG. 5, FIG. 6 and FIG. 14 are connected to each word line. In the case of FIG. 5, a crosstalk-glitch suppressing capacity is generated constantly. In the case of FIG. 6 and FIG. 14, it is generated when the reading-out word line is the selected potential. The suppressor circuits shown in FIG. 5, FIG. 6, and FIG. 14 are presented as examples, and the description provided below also applies to the case where other suppressor circuit is used.

Figure 7:
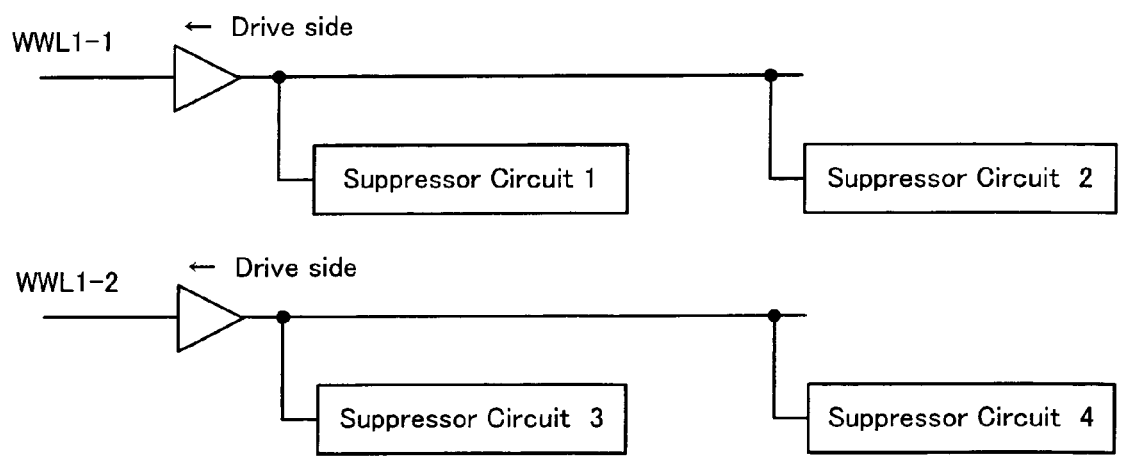
FIG. 7 is an illustration for showing an arrangement form of the crosstalk-glitch suppressor circuit according to the preferred embodiment of the present invention.

As shown in FIG. 7, the control circuit can achieve the optimum effect by selecting disposing position on the signal line as the suppression target in accordance with the circumstances. For example, when the signal line is short, the suppression effect is increased by disposing the control circuit on the drive side. Inversely, when the signal line is long, the effect can be increased by disposing it at the end of line on the opposite side of the drive side, since crosstalk glitch becomes significant as going away from the drive side. Further, a plurality of suppressor circuits may be dispersedly disposed on the signal line.

There may be cases where crosstalk glitches are different between each port. For example, referring to FIG. 4, there may be a case where a ground wiring capacitance of WWL1-2 is larger than that of WWL1-1, thus presenting no issue of crosstalk glitches, etc. In such case, deterioration in the operation speed of the writing port 2 can be prevented by not providing the suppressor circuit to WWL1-2.

Figure 8:
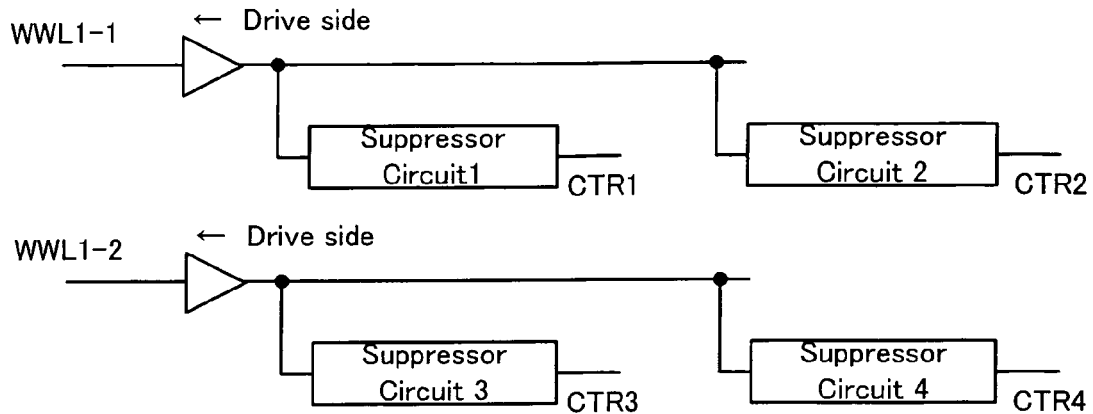
FIG. 8 is an illustration for showing an arrangement form of the crosstalk-glitch suppressor circuit according to the preferred embodiment of the present invention.

For a plurality of suppressor circuits provided on the same wiring and the suppressor circuits provided to each port, it is possible to provide each area and port with necessary suppressing capacity separately through controlling the capacities of each suppressor circuit separately as in FIG. 8. Control of the capacities of each suppressor circuit is performed by control signal lines CTR1-1 to 1-n. This control allows the necessary and minimum suppressing capacity for each signal line so that it is possible to suppress a bad influence to minimum to be exerted on the original operation of the circuit, i.e. the power and operation speed. The control signal lines for each circuit may be provided separately, or may be shared partially or entirely to be used in common. The capacity of the suppressor circuit can be controlled by following three kinds of control devices, for example.

By separating the substrate of entire circuits of the suppressor circuits provided separately or separating the substrate of a part of the circuits, the substrate potentials can be controlled by each suppressor circuit. The capacity of the suppressor circuit can be decreased by applying back bias to the substrate, and it can be increased by applying forward bias.

Figure 9:
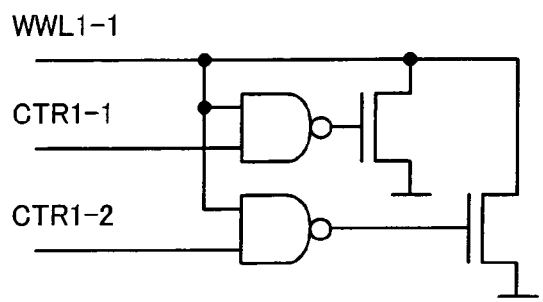
FIG. 9 is an illustration for showing a form of a control device that controls the capacity of the crosstalk-glitch suppressor circuit according to the preferred embodiment of the present invention.

As shown in FIG. 9, by providing a plurality of circuits to each suppressor circuit and controlling connection of each circuit, it is also possible to control the capacities of the suppressor circuits. In FIG. 9, by making one or both of the control signal lines CTR1-1 and 1-2 as non-selected potential, the suppressing capacity can be decreased when the suppressing capacity is unnecessary. It is the same when the same structure as that of FIG. 9 is applied to the suppressor circuits of FIG. 6 and FIG. 14.

Figure 10:
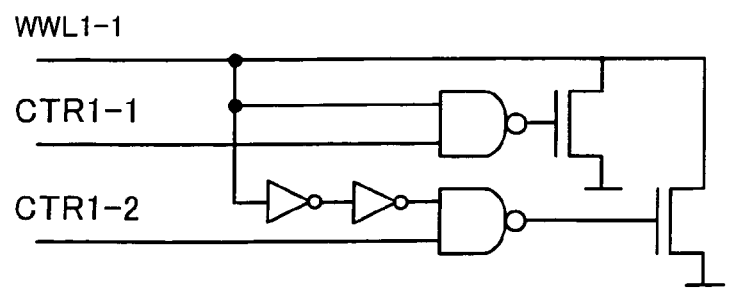
FIG. 10 is an illustration for showing a form of the control device that controls the capacity of the crosstalk-glitch suppressor circuit according to the preferred embodiment of the present invention.
Figure 11:
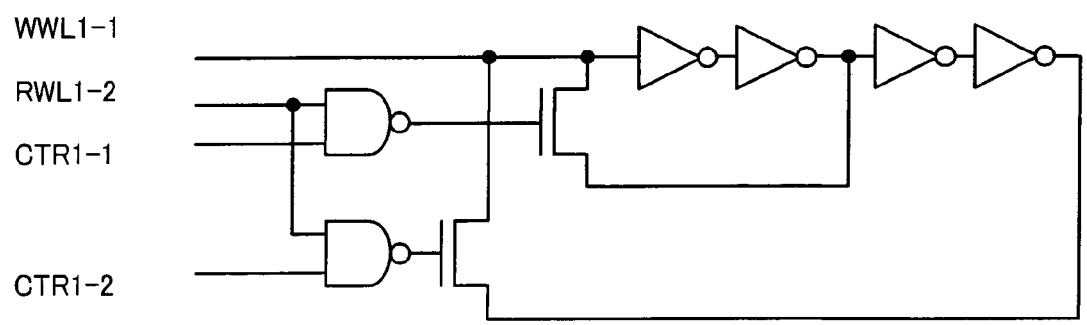
FIG. 11 is an illustration for showing a form of the control device that controls the capacity of the crosstalk-glitch suppressor circuit according to the preferred embodiment of the present invention.

In each suppressor circuit, timing for generating the capacity for suppressing crosstalk glitch can be controlled by the circuit structures shown in FIG. 10 and FIG. 11, for example. In FIG. 10 and FIG. 11, the timing of the suppressor circuit that is controlled by the control signal line CTR1-2 is delayed than that of the suppressor circuit controlled by CTR1-1. This structure provides an appropriate suppressing capacity even in the case where the crosstalk glitch is generated at a timing shifted from the operated point of the adjacent signal line or the case where the crosstalk glitch is generated over a long period of time. Furthermore, in the case where there are crosstalk glitches containing a higher harmonic component overlapped, the capacities of a plurality of suppressor circuits with different timings can be overlapped to be functioned as a filter for suppressing the higher harmonic wave, thereby decreasing the higher harmonic component.

The control signal of each control circuit may be generated based on the value of crosstalk glitch generated in the memory circuit. Specifically, a crosstalk-glitch detection circuit is provided to the signal line in the memory circuit as in FIG. 12. Based on the detected result, the controls signal group CTR and the control signals of the control circuit are generated. FIG. 13 shows examples of the detection circuit and a control signal generating circuit. In FIG. 13, between the rise of clock signal line CLK and generation crosstalk glitch, judging signal lines DET1-1 and DET1-2 that are pre-charged by initializing signal line INIT are discharged in accordance with the crosstalk glitch overlapped with WWL1-1. This state is stored in flip-flops FF1-1 and FF1-2 in the next CLK, thereby generating the control signal lines CTR1-1 and CTR1-2. With this structure, it is possible to control the capacities of the suppressor circuits according to the value of the crosstalk glitch generated in an area as a target of suppression. Therefore, it becomes possible to perform capacity control in accordance with the action of the actual circuit.

The control of each suppressor circuit may be performed according to the value of the crosstalk glitch generated in a replica circuit of the memory cell. The replica circuit constituted of a single or a plurality of memory cell(s) 10 shown in FIG. 1 may be provided in the memory circuit or outside thereof. In this case, control of the capacity of the suppressor circuit can be performed in accordance with the action of actual circuit without adding an extra circuit to the circuit as the main body. Therefore, it is possible to control the suppressor circuit without deteriorating the operation speed of the main-body circuit.

The detected value of the crosstalk glitch as described above can be reflected upon the control signal for the suppressor circuit of the main-body circuit in the same cycle by using the replica circuit. In this case, it allows the suppressor circuit to have the capacity required in the clock cycle, thereby providing effects readily responding to the actual action of the circuit.

Further, in the case where the circuit action is constant, as shown in FIG. 13, the value of the crosstalk glitch detected in a certain cycle may be reflected on the control signal of the suppressor circuit in cycles after the detected cycle. In this case, it is not essential to use the replica circuit so that the area and the number of designing steps can be reduced.

Furthermore, in the case where the use state of the circuit is constant, the value of the crosstalk glitch may be judged at the time of testing the circuit or the like, and the control signal may be fixed based on that value. In this case, it is possible to set the necessary and minimum capacity of the suppressor circuit without mounting a complicated control circuit, resulting in reduction of the area and the number of designing steps.

Figure 12:
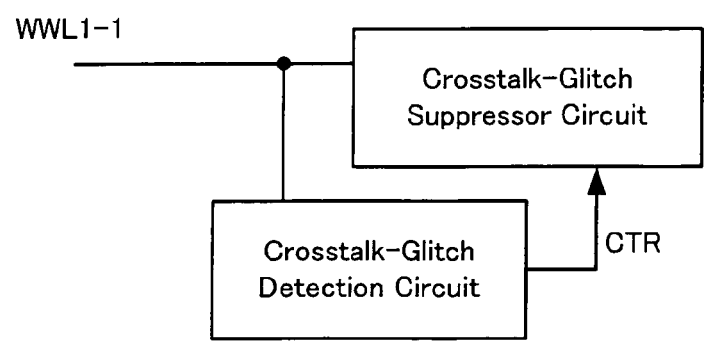
FIG. 12 is an illustration for showing a form of the control device that controls the capacity of the crosstalk-glitch suppressor circuit according to the preferred embodiment of the present invention.
Figure 13:
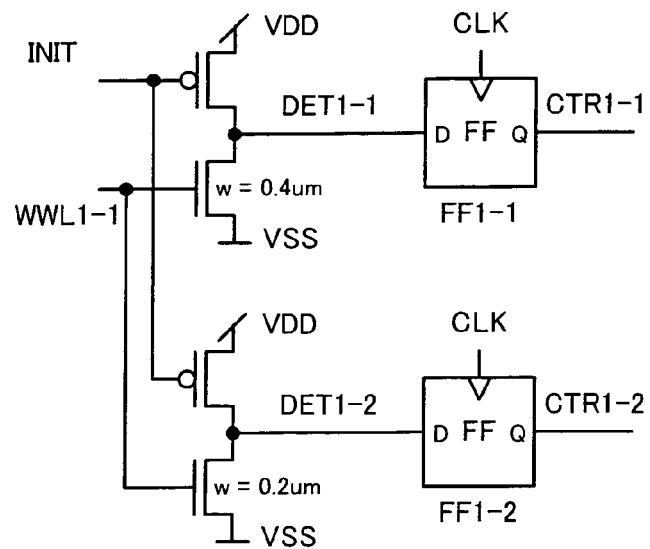
FIG. 13 is an illustration for showing a form of the control device that controls the capacity of the crosstalk-glitch suppressor circuit according to the preferred embodiment of the present invention.

The control signal for the suppressor circuit shown in FIG. 12 may be applied from outside the memory circuit. In that case, the control circuit does not have to be inside the memory circuit so that the area of the memory circuit and the number of the designing steps can be reduced. Examples of external control methods may be the controls from the processor core or from a BIST (Built-in Self Test) circuit of the memory circuit. In both cases, the area of the memory circuit and the number of the designing steps can be reduced.

As shown in FIG. 12 and FIG. 13, the control signal for the control circuit may be generated inside the memory circuit. In the case of generating the signals internally, control of the control circuit is performed within the memory circuit in a closed state. This enables the control without exerting an influence on the designs of the processor core and the peripheral circuits.

The control signal for the control circuit may be generated and applied according to the power supply voltage that operates the memory circuit. In this case, when the power supply voltage is low to an extent where the capacity of the suppressor circuit is not required, the capacity of the suppressor circuit is decreased for suppressing the influence that causes deterioration of the operation speed.

Further, the control signal for the control circuit may be generated and applied according to the frequency by which the memory circuit is operated. In this case, when the operation frequency is low to an extent where the capacity of the suppressor circuit is not required, the capacity of the suppressor circuit is decreased for suppressing the influence that causes deterioration of the operation speed.

Furthermore, the control signal for the control circuit may be generated and applied according to the potential of the internal signal line as a target of crosstalk-glitch suppression. In this case, when the potential of the internal signal line as the target of the crosstalk-glitch suppression is decreased by the resistance component of the internal power supply wiring, the capacity of the suppressor circuit is decreased for suppressing the influence that causes deterioration of the operation speed.

While the invention has been described and illustrated in detail, it is to be clearly understood that this is intended be way of illustration and example only and is not to be taken by way of limitation, the spirit and scope of this invention being limited only be the terms of the following claims.

What is claimed is:

1. A memory circuit, comprising:
one or more reading-out ports; one or more writing ports; a crosstalk-glitch suppressor circuit configured to provide a variable amount of crosstalk glitch suppression between internal signal lines of each of said ports; and a control device for varying the amount of suppression performed by said crosstalk-glitch suppressor circuit.

2. The memory circuit according to claim 1, wherein said crosstalk-glitch suppressor circuit is disposed at a plurality of positions on a signal line.

3. The memory circuit according to claim 2, wherein said control device varies said amount of suppression performed at each position on the signal line at which said crosstalk-glitch suppressor circuit is disposed.

4. The memory circuit according to claim 1, wherein said crosstalk-glitch suppressor circuit is provided to each of said ports.

5. The memory circuit according to claim 1, wherein said control device varies said amount of suppression performed by said suppressor circuit by controlling a substrate potential of said crosstalk-glitch suppressor circuit.

6. The memory circuit according to claim 1, wherein said control device varies said amount of suppression performed by said suppressor circuit by controlling number of connections of said crosstalk-glitch suppressor circuit.

7. The memory circuit according to claim 1, wherein said control device varies said amount of suppression performed by said suppressor circuit by controlling a timing of generating said amount of suppression performed by said crosstalk-glitch suppressor circuit.

8. The memory circuit according to claim 1, wherein said control device generates a control signal to vary the amount of suppression performed by said suppressor circuit according to a detected value of crosstalk glitch generated in said memory circuit.

9. The memory circuit according to claim 8, wherein said control device generates, according to a detected value of crosstalk glitch in a first clock cycle, a control signal used in the first clock cycle to vary the amount of suppression performed by said suppressor circuit.

10. The memory circuit according to claim 8, wherein said control device generates, according to a detected value of crosstalk glitch in a first clock cycle, a control signal used in a second clock cycle after the first clock cycle to vary the amount of suppression performed by said suppressor circuit.

11. The memory circuit according to claim 8, wherein said control device fixes, according to a detected value of crosstalk glitch in a first clock cycle, a control signal used in the first clock cycle and a clock cycle after the first clock cycle to vary the amount of suppression performed by said suppressor circuit.

12. The memory circuit according to claim 1, wherein said control device generates a control signal to vary the amount of suppression performed by said suppressor circuit according to a detected value of crosstalk glitch generated in a replica circuit that is provided in said memory circuit or outside said memory circuit, the replica circuit including a memory cell.

13. The memory circuit according to claim 1, wherein said control device varies said amount of suppression performed by said suppressor circuit in response to a control signal applied from outside said memory circuit.

14. The memory circuit according to claim 13, wherein said control signal applied from outside is generated in a processor core.

15. The memory circuit according to claim 13, wherein said control signal applied from outside is generated in a BIST circuit.

16. The memory circuit according to claim 1, wherein said control device varies said amount of suppression performed by said suppressor circuit in response to a control signal generated inside said memory circuit.

17. The memory circuit according to claim 1, wherein said control device varies said amount of suppression performed by said suppressor circuit in response to a control signal that is generated according to power supply voltage for operating said memory circuit.

18. The memory circuit according to claim 1, wherein said control device varies said amount of suppression performed by said suppressor circuit in response to a control signal that is generated according to frequency by which said memory circuit is operated.

19. The memory circuit according to claim 1, wherein said control device varies said amount of suppression performed by said suppressor circuit in response to a control signal that is generated according to potential of an internal signal line as a target of crosstalk-glitch suppression.

* * * * *